United States Patent [19]

Ritter et al.

[11] Patent Number: 4,789,414
[45] Date of Patent: Dec. 6, 1988

[54] METHOD AND APPARATUS FOR MAINTAINING WIRE LEAD PROTECTION OF COMPONENTS ON A STORAGE REEL

[75] Inventors: Rodney L. Ritter, Woodhaven, Mich.; John F. Crake, Ajax; Tony Lacza, Agincourt, both of Canada

[73] Assignee: Ford Motor Company, Dearborn, Mich.

[21] Appl. No.: 13,492

[22] Filed: Feb. 11, 1987

[51] Int. Cl.⁴ .............................................. B65D 73/02
[52] U.S. Cl. .................................. 156/184; 206/330; 206/340
[58] Field of Search ............... 156/184, 289; 206/330, 206/390

[56] References Cited

U.S. PATENT DOCUMENTS

| | | |
|---|---|---|
| 3,140,773 | 7/1964 | Cheh ................................ 206/330 X |
| 3,231,082 | 1/1966 | Weiss ................................ 206/330 X |
| 3,724,068 | 4/1973 | Galli . |
| 3,797,655 | 3/1974 | Boone et al. ........................ 206/330 |
| 3,906,614 | 9/1975 | Rayburn . |
| 4,049,118 | 9/1977 | Honda et al. ........................ 206/330 |
| 4,069,916 | 1/1978 | Fowler et al. ........................ 206/330 |
| 4,079,509 | 3/1978 | Jackson et al. . |
| 4,166,562 | 9/1979 | Keizer et al. . |
| 4,301,921 | 11/1981 | Detuch ............................. 206/390 X |
| 4,307,832 | 12/1981 | Taki et al. . |
| 4,329,776 | 5/1982 | Mori et al. . |
| 4,411,361 | 10/1983 | Mentzer ............................ 206/330 X |
| 4,438,559 | 3/1984 | Asai et al. . |
| 4,447,287 | 5/1984 | Hofbauer . |
| 4,489,487 | 12/1984 | Bura . |
| 4,516,737 | 5/1985 | Gliwa et al. . |

*Primary Examiner*—David Simmons
*Attorney, Agent, or Firm*—Paul K. Godwin, Jr.; Clifford L. Sadler

[57] ABSTRACT

A flexible innerlayer tape having a corrugated portion in which the corrugation runs along the length on the tape. The innerlayer tape is wound onto a storage reel with radially leaded electrical components so as to provide separation between the wound layers of components, support for the leads and protection against a change in the lead wire orientation while on the storage reel.

11 Claims, 2 Drawing Sheets

METHOD AND APPARATUS FOR MAINTAINING WIRE LEAD PROTECTION OF COMPONENTS ON A STORAGE REEL

BACKGROUND OF THE INVENTION

1. Field of the Invention

The present invention is directed to the field of automatic systems for inserting the wire leads of electrical components into printed circuit boards and specifically to the area of providing improved protection to the oriented leads wires of such components stored on tape reels.

2. Description of the Prior Art

Automatic machine assembly of electrical printed circuit boards requires a continuous and ready supply of electrical components such as those shown in U.S. Pat. No. 4,329,776. Such components have radially oriented leads sandwiched between layers of tape and precisely spaced therealong and wound on a reel for storage and subsequent loading into an automatic insertion machine. The automatic insertion machine, of course, requires that the leads of each component be precisely located on the tape and be properly oriented, in order that accurate insertion can be made into specified apertures in the printed circuit board. In order to overcome the tendency of components to become interstitially meshed together when wound onto the reel, U.S. Pat. Nos. 4,447,287 and 4,516,737 illustrate the use of an interleaved strip of protective paper wound onto the reels. The interleaved strip of protective paper provides a separation between each layer of components and reduces their tendency of becoming interstitially locked in between components of another layer.

SUMMARY OF THE INVENTION

Even though more recent supplies of electrical components on storage reels have included the prior art interleaved strip of protective paper between layers of components wound on the reel, it has been found that many times the lead wires on the components are bent from the predetermined orientation and cause jamming of the automatic insertion equipment. It has been found that often times the bending of the wire leads occurs because of excessive tension in the carrier tape strip during winding onto the storage reel; because of compression forces on the lead wires made by the accidental overlapping of reel side wheels during shipping; or because of numerous other mishandling reasons that take advantage of the compressible spacing between the layers of leads on the reels.

The problem of bent leads results in some cases to the rejection of an entire reel of components due to its unsuitability in use on the automatic insertion machines. In other cases, a random misalignment of leads causes equipment jamming and delays due to down time of the equipment while the misaligned component is manually removed.

The present invention is intended to provide a method and apparatus for protecting the predetermined lead wire orientation on components wound onto a storage reel in which the lead wires of the components are attached to a first flexible tape material. The invention involves the use of a second flexible tape having a corrugated spacer portion in which the corrugations run in the length direction of the tape and have a peak to peak height that is at least equal to the width dimension of the components and are aligned to overlay the lead wires of the components. When wound, the corrugated tape provides interleaved and supported spacing of the lead wire portions of the components layer by layer.

The innerlayer tape also includes a noncorrugated portion adjacent to the corrugated portion that extends laterally so as to provide conventional interleaved separation of the components wound onto the reel.

DETAILED DESCRIPTION OF THE PREFERRED EMBODIMENT

Figure 1:
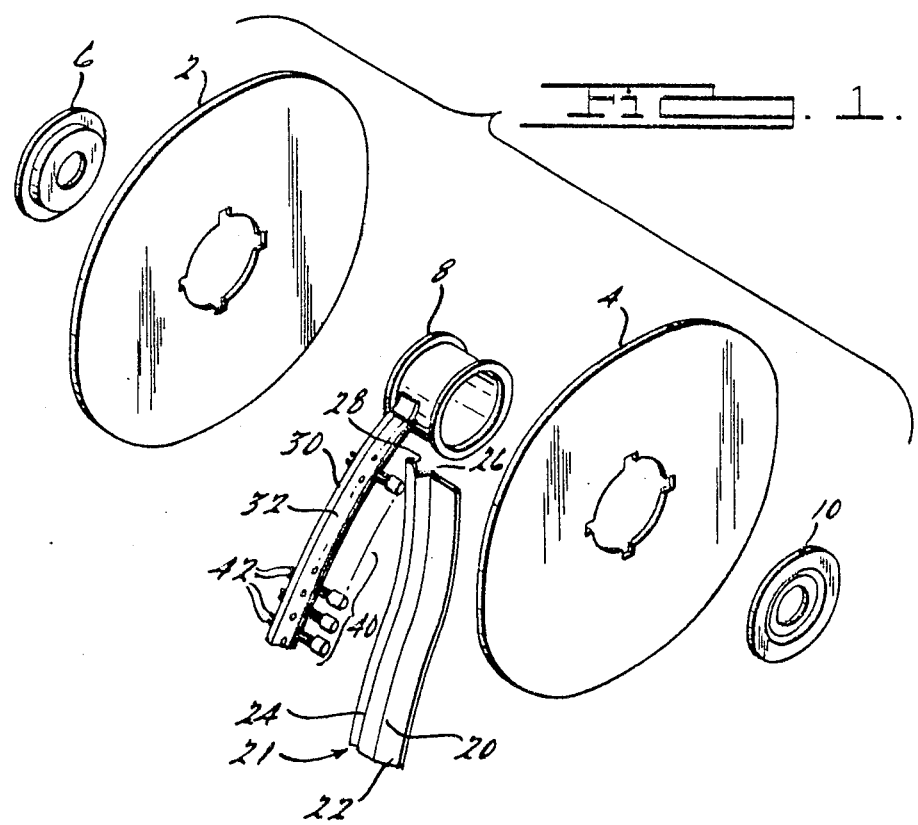
FIG. 1 is an exploded view of a component storage reel incorporating the present invention.

The elements which makeup a conventional reel for electronic components is shown in FIG. 1 as including two relatively rigid planar wheels 2 and 4 separated by a predetermined distance and concentrically connected to a winding core axle 8 with attaching end clamps 6 and 10. Radial leaded components 40, having a known thickness dimension, are mounted onto a sprocketed carrier tape 30 and held thereto by a hold-down tape 32 adhesively attached to the upper surface of the carrier tape 30. The lead wires 42 are captured between the carrier tape 30 and the hold-down tape 32 in a predetermined orientation.

The improvment offered by the present invention lies in the use of an innerlayer tape 20 containing a corrugation 21 running along the length of the tape. The corrugation is positioned laterally on the tape so that when the tape is wound onto the reel, the corrugation serves to contact and separate the leads 42 of each layer wound on the reel by an amount equal to the respective thickness dimensions of the components.

While the preferred embodiment of the invention illustrated shows the corrugation 21 as being a single crease which runs the length of the tape, it is foreseen that the shape of the corrugation will depend upon the size of the separation and the material from which the tape is formed. It is further envisioned that the corrugation may be a plurality of creases in instances where a relatively thin paper material is employed; a series of embossed furrows where a thermal setting material such as polystyrene is used; or any other spacer material that functions in an equivalent manner to achieve the intended purpose. In any event, the purpose of the innerlayer 20 is to provide support and separation of the layers of components wound upon the reel wherein the actual support and separation is performed by the spacer portion at the leads so that each component attached to the carrier tape 30 is parallel to those on adjacent layers.

Figure 2:
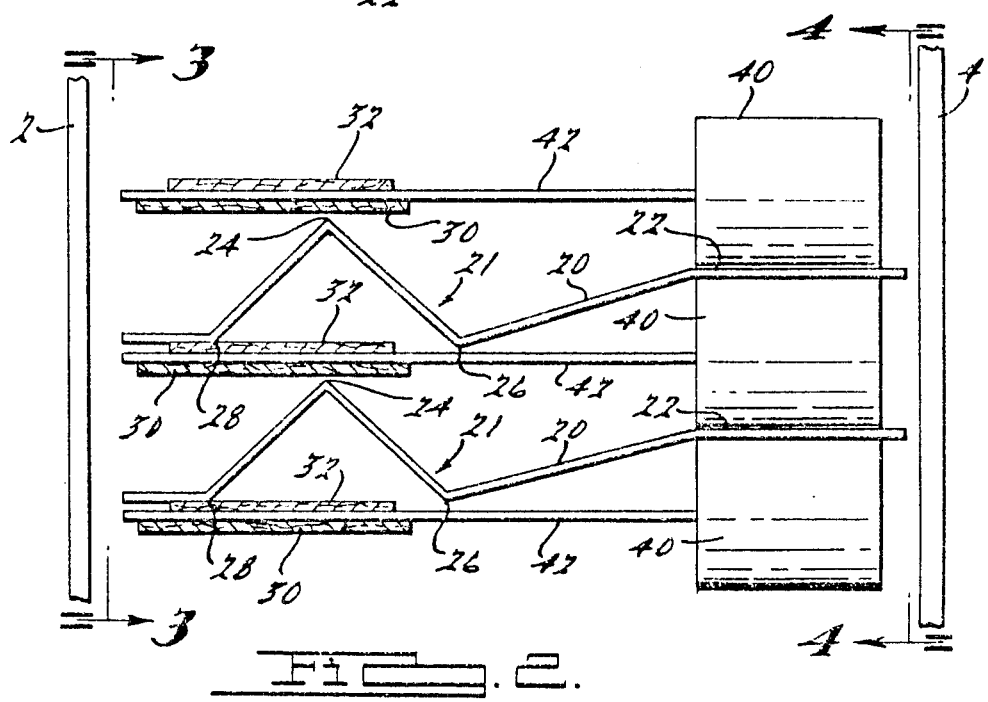
FIG. 2 is a partial cross-seotion of the assembled storage reel with several layers of components wound thereon and incorporating the present invention.

FIG. 2 is an elevational cross-section of three layers of components wound onto a reel containing rigid wheels 2 and 4 such as that shown in FIG. 1. The components 40, have a known thickness and are each attached via lead wires 42 to the carrier tape 30. The innerlayer tape 20 is shown as having the corrugated portion 21 positioned so as to provide separation between the leads 42 of the several layers wound onto the reel. In the embodiment shown, a central crease 24 of the corrugation 21 abuts the upper layer of carrier tape 30, while the outer creases 26 and 28 are forced into abutment against the hold-down tape 32 or the leads 42 of the underlying layer. The actual contact of the crease 26 will depend upon the crease angles employed. A noncorrugated extension of the innerlayer tape 20 is shown as a portion 22 extending between the components 40 so as to provide layer separation therebetween.

Figure 3:
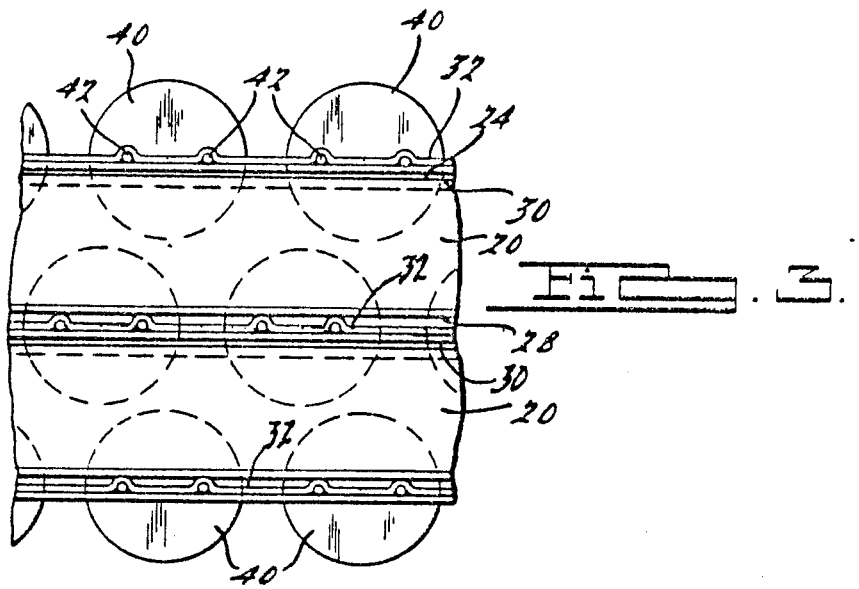
FIG. 3 is a partial cross-sectional view taken along lines III—III in FIG. 2.

FIG. 3 is an end view of the section taken in FIG. 2 along lines III—illustrate the contact points 24 and 28 of the innerlayer tape 20 respectively abutting the lower surface of the carrier tape 30 and the upper surface of the hold-down tape 32.

Figure 4:
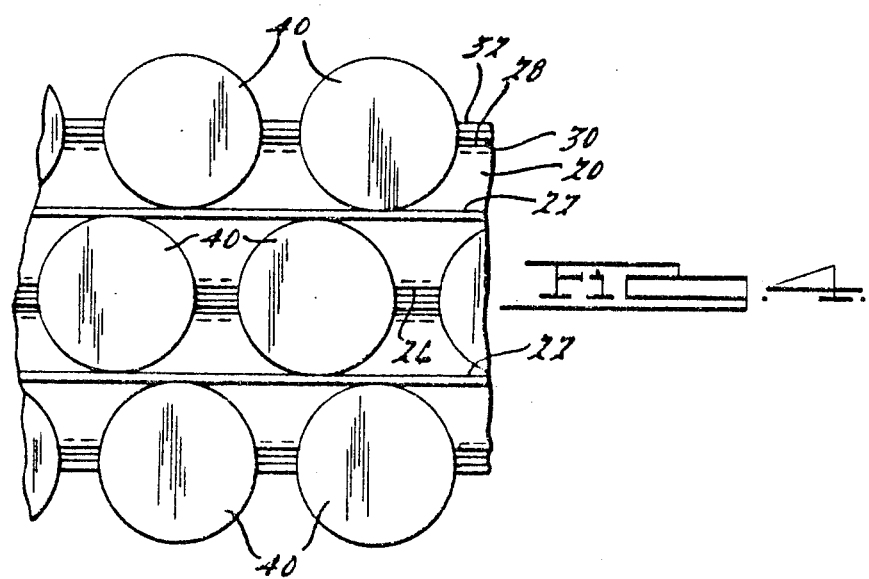
FIG. 4 is a partial cross-sectional view taken along lines IV—IV in FIG. 2.

FIG. 4 is an end view of the section taken in FIG. 2 along lines IV—V and illustrates the separation of the components 40 provided by the uncorrugated portion 22 of the innerlayer tape 20.

Figure 5:
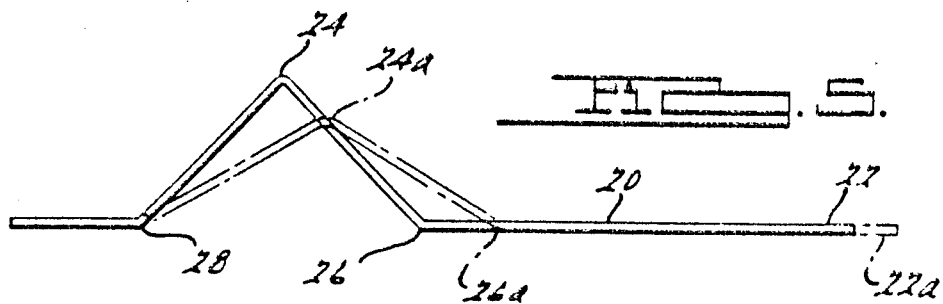
FIG. 5 is a sectional view of the innerlayer tape embodying the present invention.

FIG. 5 is a cross-section of the innerlayer tape 20 with a single corrugation. A compression of the peak 24 is resisted by the resilient nature of the material. However, when compressed to a point 24A, the lower creases 26 and 28 would normally be expanded in an outward condition to thereby cause the overall width of the tape to be somewhat expanded. If the material used for the flexible innerlayer is subject to such compression as the components are wound onto the reel, one solution would be to make the flexible innerlayer tape of a noncompressible material or to increase the rigidity of the wheels 2 and 4 and accurately space them to limit movement of the tape ends and thereby suppress any compression of the corrugated spacer portion of the tape.

It will be apparent that many modifications and variations may be implemented without departing from the scope of the novel concept of this invention. Therefore, it is intended by the appended claims to cover all suCh modifications and variations which fall within the true spirit and scope of the invention.

We claim:

1. A method of protecting the predetermined lead wire orientation of electrical components having known thickness dimensions wound onto a reel including the steps of:
   providing a tape reel with a pair of opposing planar rigid wheels separated by a predetermined distance and a central axle joining the wheels;
   attaching the lead wires of each component in a predetermined orientation to a first flexible tape material having a width dimension that is less than said predetermined distance;
   providing a second flexible tape having a spacer portion in which the spacer portion runs in the length direction of the tape and has a thickness dimension that is at least equal to the thickness dimension of the components attached to the first tape;
   attaching said component bearing first tape to said central axle;
   aligning said spacer portion of said second tape to overlay only the lead wires of said components; and
   winding said first tape bearing said components, and said overlaying second tape onto said reel to thereby provide each wound layer of components separated each from the other by said second tape.

2. A method as in claim 1, wherein said step of providing said second tape includes the providing of a tape in which said spacer portion is a corrugation that runs in the length direction of the tape.

3. A method as in claim 2, wherein said step of providig said second tape includes the providing of a tape that approximates but is less than said predetermined distance between said wheels and contains a noncorrugated portion runing the length of the tape.

4. A method as in claim 3, wherein said step of aligning said corrugation includes the step of aligning said noncorrugated portion to overlap the components attached to said first tape.

5. An innerlayer tape for separating electrical components having lead wires attached to a carrier tape and wound onto a storage reel comprising:
   a spacer portion in which the spacer portion runs along the length of said innerlayer tape for overlaying the lead wire portions of said components attached to said carrier tape.

6. An innerlayer tape as in claim 5, formed of a relatively flexible material for winding on said reel and said spacer portion is relatively noncompressible to maintain separation of the leads in each layer wound onto said transport reel.

7. An innerlayer tape as in claim 6, wherein said spacer portion has a thickness dimension that is greater than the thickness dimension of said components attached to said carrier tape.

8. An innerlayer tape as in claim 7, including a relatively thin portion running the length of said tape and located adjacent said spacer portion to overlap and provide separation between the layers of components wound on said reel.

9. An innerlayer tape as in claim 5, wherein said spacer portion is a corrugation formed in said tape to run along the length of said innerlayer tape.

10. An innerlayer tape as in claim 9, wherein said corrugated portion has a peak-to-peak height that is greater than the thickness dimension of said components attached to said carrier tape.

11. An innerlayer tape as in claims 9 or 10, which further includes a noncorrugated portion running the length of said innerlayer tape and located adjacent said corrugated portion to overlap and provide separation between the layers of components wound on said reel.

* * * * *